United States Patent
Brunner et al.

(10) Patent No.: US 6,891,204 B2
(45) Date of Patent: May 10, 2005

(54) SEMICONDUCTOR COMPONENT HAVING FIELD-SHAPING REGIONS

(75) Inventors: Heinrich Brunner, Dorfen (DE); Franz Auerbach, München (DE); Jenoe Tihanyi, Kirchheim (DE)

(73) Assignee: Infineon Technologies AG, Munich (DE)

( * ) Notice: Subject to any disclaimer, the term of this patent is extended or adjusted under 35 U.S.C. 154(b) by 11 days.

(21) Appl. No.: 09/816,927

(22) Filed: Mar. 23, 2001

(65) Prior Publication Data

US 2001/0045567 A1 Nov. 29, 2001

Related U.S. Application Data

(63) Continuation of application No. PCT/DE99/02732, filed on Sep. 1, 1999.

(30) Foreign Application Priority Data

Sep. 23, 1998 (DE) .......................................... 198 43 659

(51) Int. Cl.$^7$ ......................... H01L 29/32; H01L 29/423
(52) U.S. Cl. ...................................... 257/107; 257/133
(58) Field of Search ................................ 257/107, 133, 257/110, 285

(56) References Cited

U.S. PATENT DOCUMENTS

| | | | | |
|---|---|---|---|---|
| 4,980,742 A | | 12/1990 | Stengl et al. | |
| 5,113,237 A | * | 5/1992 | Stengl | ......................... 257/489 |
| 5,175,598 A | * | 12/1992 | Nishizawa et al. | .......... 257/107 |
| 5,324,971 A | * | 6/1994 | Notley | ......................... 257/328 |
| 5,945,701 A | * | 8/1999 | Siergiej et al. | .............. 257/285 |

FOREIGN PATENT DOCUMENTS

EP    0 344 514 A2    12/1989

* cited by examiner

*Primary Examiner*—Amir Zarabian
*Assistant Examiner*—Kiesha Rose
(74) *Attorney, Agent, or Firm*—Laurence A. Greenberg; Werner H. Stemer; Gregory L. Mayback

(57) ABSTRACT

A semiconductor element has a semiconductor body of a first conductivity type. The semiconductor body has a zone of a second conductivity type embedded. Further regions of the second conductivity type surround the zone of the second conductivity type like a well. The further regions are interrupted in at least one location by a channel that is formed by the semiconductor body. The further regions are doped with a doping concentration that is high enough so that the further regions are not completely depleted of charge carriers when the semiconductor element is revere-biased.

20 Claims, 3 Drawing Sheets

SEMICONDUCTOR COMPONENT HAVING FIELD-SHAPING REGIONS

CROSS-REFERENCE TO RELATED APPLICATION

This application is a continuation of copending International Application No. PCT/DE99/02732, filed Sep. 1, 1999, which designated the United States and which was not published in the English language.

BACKGROUND OF THE INVENTION

Field of the Invention

The invention relates to a semiconductor component having a semiconductor body of at first conductivity type, that has a doping concentration of more than $5 \times 10^{13}$ charge carriers per $cm^3$ and is provided with in each case at least one electrode on two mutually opposite surfaces. At least one of the electrodes makes contact with a semiconductor zone of a second conductivity type opposite to the first conductivity type. The invention relates in particular to an edge structure for such a semiconductor component.

The minimum basic doping of silicon power components is about $8 \times 10^{12}$ charge carriers $cm^{-3}$. In the case of such a basic doping, the bulk reverse voltage of a semiconductor body having a pn junction is of the order of magnitude of 10 kV at room temperature.

In the case of monocrystalline silicon, the intrinsic carrier density at 300° K., that is to say at room temperature, of thermally generated electron-hole pairs is about $1.38 \times 10^{10}$ charge carriers $cm^{-3}$. Such a concentration of the order of magnitude of $10^{10}$ charge carriers $cm^{-3}$ is usually negligible relative to the basic doping of $8 \times 10^{12}$ charge carriers $cm^{-3}$, which is virtually three orders of magnitude higher than the intrinsic charge carrier density.

It should be taken into consideration, however, that the intrinsic density rises exponentially with temperature, with the result that, in the case of a low doping concentration, the intrinsic charge carrier density can increase to a value corresponding to the charge carrier density provided by the basic doping. Thus, by way of an example, an intrinsic density which is reached at a temperature as low as 150° C. (in this case "intrinsic temperature") corresponds to a basic doping of about $1 \times 10^{13}$ charge carriers $cm^{-3}$. In other words, if the temperature of the semiconductor component lies in the intrinsic range, then the reverse current is drastically increased on account of the thermally generated electron-hole pairs.

These physical specifications inherently restrict the possibilities for using semiconductor components in power engineering, in which voltages of up to 20 kV or more occur. In order nevertheless to be able to control such high voltages, series circuits including a plurality of semiconductor components are used. Moreover, care is taken to ensure that, in the case of semiconductor components having a low basic doping of, for example, less than $1 \times 10^{13}$ $cm^{-3}$ charge carriers in silicon, the maximum operating temperature is not allowed to exceed about 100° C., in order thus to avoid high reverse currents on account of a rising intrinsic density.

European Patent No. EP-B1-0 344 514 discloses a defeatable thyristor having a semiconductor body, which has an n-type emitter layer with an adjoining p-type base layer, a cathodal electrode making contact with the n-type emitter layer, and a p-type emitter layer with an adjoining n-type base layer, an anodal electrode making contact with the p-type emitter layer. The base layers are isolated from one another by a pn junction subject to a reverse-biasing of the thyristor in the blocking state. One of the base layers is provided with a gate electrode to which a turn-off voltage pulse can be fed which causes the thyristor to turn off. At least one semiconductor layer is inserted into the base layer with which the gate electrode does not make contact. This semiconductor layer is not connected to external potentials, runs essentially parallel to the pn junction, is oppositely doped with respect to the base layer and is thin in comparison with the thickness of the semiconductor body. The distance of the semiconductor layer from the pn junction is chosen to be so small that the maximum field strength of the space charge zone (depletion zone) which builds up at the pn junction when the thyristor is turned off is limited to a value below a critical value which results in an avalanche breakdown with regard to the charge carriers to be depleted in the event of turn-off. The semiconductor layers which are inserted into a base layer and are oppositely doped with respect thereto are provided with continuous cutouts whose dimensions in the lateral direction are small relative to the thickness of the respectively adjoining space charge zones that build up when the thyristor is turned off. In this case, the cutouts may be disposed in such a way as to produce a lattice-shaped structure of the semiconductor layers. The cutouts are intended to improve the ignition behavior of the thyristor.

SUMMARY OF THE INVENTION

It is accordingly an object of the invention to provide a semiconductor component which overcomes the above-mentioned disadvantages of the heretofore-known components of this general type and which has a high intrinsic temperature and can thus avoid large reverse currents despite high applied voltages.

With the foregoing and other objects in view there is provided, in accordance with the invention, a semiconductor component, including:

a semiconductor body of a first conductivity type, the semiconductor body having a first doping concentration greater than $5 \times 10^{13}$ charge carriers $cm^{-3}$ and having a first surface and a second surface, the first and second surfaces being provided opposite from one another;

at least a first electrode being disposed on the first surface and at least a second electrode disposed on the second surface;

a semiconductor zone of a second conductivity type opposite to the first conductivity type;

a pn-junction formed between the semiconductor zone of the second conductivity type and the semiconductor body;

at least one of the first and second electrodes being in contact with the semiconductor zone of the second conductivity type;

semiconductor regions of the second conductivity type provided in the semiconductor body;

the semiconductor regions being disposed at a respective distance from the semiconductor zone of the second conductivity type such that the semiconductor regions surround the semiconductor zone of the second conductivity type like a well;

the semiconductor regions being interrupted in each case at at least one location by channels formed by the semiconductor body; and the semiconductor regions of the second conductivity type having a second doping concentration that is high enough such that the semiconductor regions are not completely depleted of charge carriers in case of a reverse-biasing of the pn-junction.

In other words, the object of the invention is achieved by a semiconductor component having a semiconductor body of a first conductivity type, which has a doping concentration of above $5 \times 10^{13}$ charge carriers $cm^{-3}$ and is provided with in each case at least one electrode on two mutually opposite surfaces, in which case at least one of the electrodes makes contact with a semiconductor zone of a second conductivity type opposite to the first conductivity type, in which case regions of the second conductivity type are provided in the semiconductor body, at a distance from the zone of the second conductivity type, the regions surrounding the zone of the second conductivity type in a well-like manner and being interrupted in each case at at least one location by channels of the semiconductor body and the regions of the second conductivity type are so highly doped that they are not completely depleted of charge carriers in the case of reverse-biasing of the pn junction formed between the zone of the second conductivity type and the semiconductor body.

The invention thus provides a semiconductor component having a semiconductor body of the first conductivity type. Regions of the second conductivity type are embedded in this semiconductor body of the first conductivity type in such a way that there are an arbitrary number of zones of the first conductivity type in the semiconductor body, which have a basic doping which is greater than $5 \times 10^{13}$ charge carriers $cm^{-3}$. These zones of the first conductivity type are connected to one another via channels which lead through the regions of the second conductivity type. The doping concentration in the regions of the second conductivity type is defined in such a way that these regions are not completely depleted of charge carriers in the case of reverse-biasing of the semiconductor component.

The regions of the second conductivity type are preferably provided at a distance from the zone of the second conductivity type and in a well-shaped manner around the zone of the second conductivity type and are interrupted by the channels of the first conductivity type. Electric fields having a trapezoidal profile build up in the zones of the first conductivity type in the case of reverse-biasing, the length of such a "field strength trapezoid" being defined by the length of the respective zones of the first conductivity type, that is to say by the distance between two adjacent regions of the second conductivity type. By increasing the number of regions of the second conductivity type which are in each case interrupted by the channels of the first conductivity type which connect the zones of the first conductivity type to one another, it is possible to string together as many "field strength trapezoids" as desired, which leads to a corresponding increase of the reverse voltage.

As a result of the higher basic doping in the semiconductor body, that is to say in the zones of the first conductivity type, the intrinsic temperature is significantly higher than in the case of a homogeneously doped semiconductor body, when a comparable reverse voltage is present in each case. This distinctly alleviates the abovementioned restriction with regard to the operating temperature below a maximum of 100° C.

In the case of the semiconductor component according to the invention, then, the semiconductor body is configured by series-connecting "field strength trapezoids" in such a way that practically any desired reverse voltages can be achieved, without further reducing the basic doping of the semiconductor body and hence also the intrinsic temperature. This series connection of "field strength trapezoids" is comparable in the case of edge structures with field ring systems which act as voltage dividers for the space charge zone.

The regions of the second conductivity type are preferably configured in such a way that the space charge zones of the individual field strength trapezoids reach the surface of the semiconductor body or as far as the nearest "layer" of the regions of the second conductivity type which are provided in the well-shaped manner, in order to avoid, in the bulk of the semiconductor body, peak values of the electric field which lie above the critical field strength.

The channels of the first conductivity type which are routed between the regions of the second conductivity type connect, as has been explained above, the zones of the first conductivity type which are created by these regions, with the result that the operating current can flow through the channels. These channels, then, should be configured in such a way that no spikes of the electric field occur in them.

An insulating zone, for example including a silicon dioxide layer, may additionally be incorporated in the semiconductor body, in order to shield charge carriers from the edge region of the semiconductor component.

The invention can preferably be applied to diodes, thyristors, transistors, such as MOS transistors or IGBTs (Insulated Gate Bipolar Transistors) and other known semiconductor power components.

According to another feature of the invention, the semiconductor regions of the second conductivity type are interrupted in each case at a plurality of locations by the channels formed by the semiconductor body for increasing a reverse voltage.

According to yet another feature of the invention, the channels are configured such that electric field spikes are avoided when a reverse voltage is applied between the first and second electrodes.

According to a further feature of the invention, the semiconductor body has a drift region between the electrodes; and the channels are provided in the drift region.

According to yet a further feature of the invention, the semiconductor body has an edge region; and the channels are provided in the edge region.

According to another feature of the invention, the semiconductor body has an edge zone; and an insulating zone is provided for shielding charge carriers from the edge zone.

According to a further feature of the invention, an injector is disposed in at least one of the first and second surfaces.

According to an additional feature of the invention, one of the first and second surfaces surrounds the semiconductor zone of the second conductivity type; and field plates are provided on this surface.

According to another feature of the invention, the semiconductor body has an edge; and a doped guard ring zone of the first conductivity type surrounds the edge.

According to yet another feature of the invention, the first conductivity type is an n-conductivity type.

With the objects of the invention in view there is also provided, a semiconductor configuration, including:

a semiconductor component such as a diode, a MOS transistor or a thyristor;

the semiconductor component including:

a semiconductor body of a first conductivity type, the semiconductor body having a first doping concentration greater than $5 \times 10^{13}$ charge carriers $cm^{-3}$ and having a first surface and a second surface, the first and second surfaces being provided opposite from one another;

at least a first electrode being disposed on the first surface and at least a second electrode disposed on the second surface;

a semiconductor zone of a second conductivity type opposite to the first conductivity type;

a pn-junction formed between the semiconductor zone of the second conductivity type and the semiconductor body;

at least one of the first and second electrodes being in contact with the semiconductor zone of the second conductivity type;

semiconductor regions of the second conductivity type provided in the semiconductor body;

the semiconductor regions being disposed at a respective distance from the semiconductor zone of the second conductivity type such that the semiconductor regions surround the semiconductor zone of the second conductivity type like a well;

the semiconductor regions being interrupted in each case at at least one location by channels formed by the semiconductor body; and the semiconductor regions of the second conductivity type having a second doping concentration which is high enough such that the semiconductor regions are not completely depleted of charge carriers in case of a reverse-biasing of the pn-junction.

Other features which are considered as characteristic for the invention are set forth in the appended claims.

Although the invention is illustrated and described herein as embodied in a semiconductor component having field-shaping regions, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

In the figures, corresponding parts are respectively provided with the same reference symbols. Moreover, in the figures not all of the sectional parts are hatched, for the sake of better illustration. It is also noted that the respective conductivity types illustrated in the exemplary embodiments can, of course, be reversed.

Figure 1:
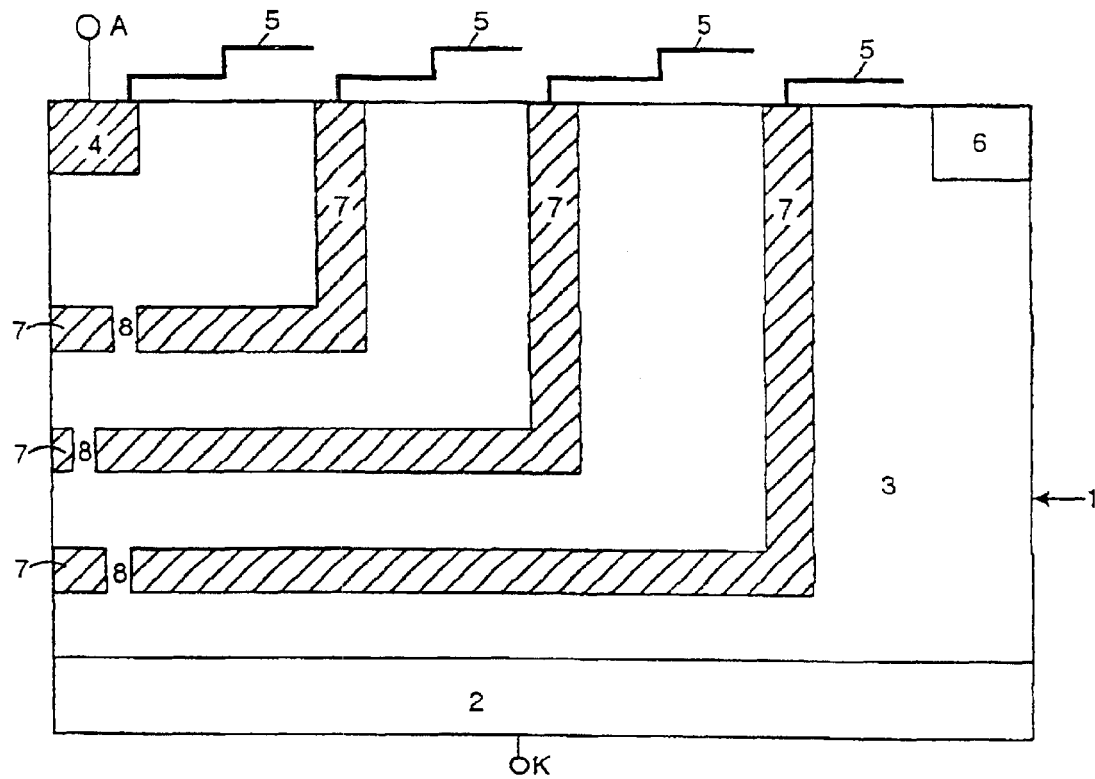
FIG. 1 is a diagrammatic sectional view of a diode having a patterned semiconductor body and regions of the second conductivity type which are continuous in the edge region.

Referring now to the figures of the drawings in detail and first, particularly, to FIG. 1 thereof, there is shown a semiconductor body 1 including an $n^+$-conducting semiconductor substrate 2 and an $n^-$-conducting semiconductor layer 3 having a basic doping which is $5 \times 10^{13}$ charge carriers $cm^{-3}$ or more.

A cathode K is connected to the semiconductor substrate 2, while an anode A is connected to a $p^+$-conducting zone 4.

Field plates 5 are provided on the top side of the semiconductor body 1 on or in an insulating layer (not specifically illustrated) made of silicon dioxide, for example. Moreover, an $n^+$-conducting guard ring 6 is additionally embedded in that surface of the semiconductor body 1 which faces the field plates 5. This guard ring 6, like the field plates 5, serves for increasing the breakdown strength of the diode in the edge region thereof.

The invention then provides p-conducting regions 7, which surround the zone 4 at a distance in a well-shaped manner and are interrupted by channels 8 in the drift region below the zone 4, through which channels the operating current can flow between anode A and cathode K.

The regions 7 are so highly doped that they are not completely depleted of charge carriers in the case of reverse-biasing when the reverse voltage is applied between anode A and cathode K.

Figure 2:
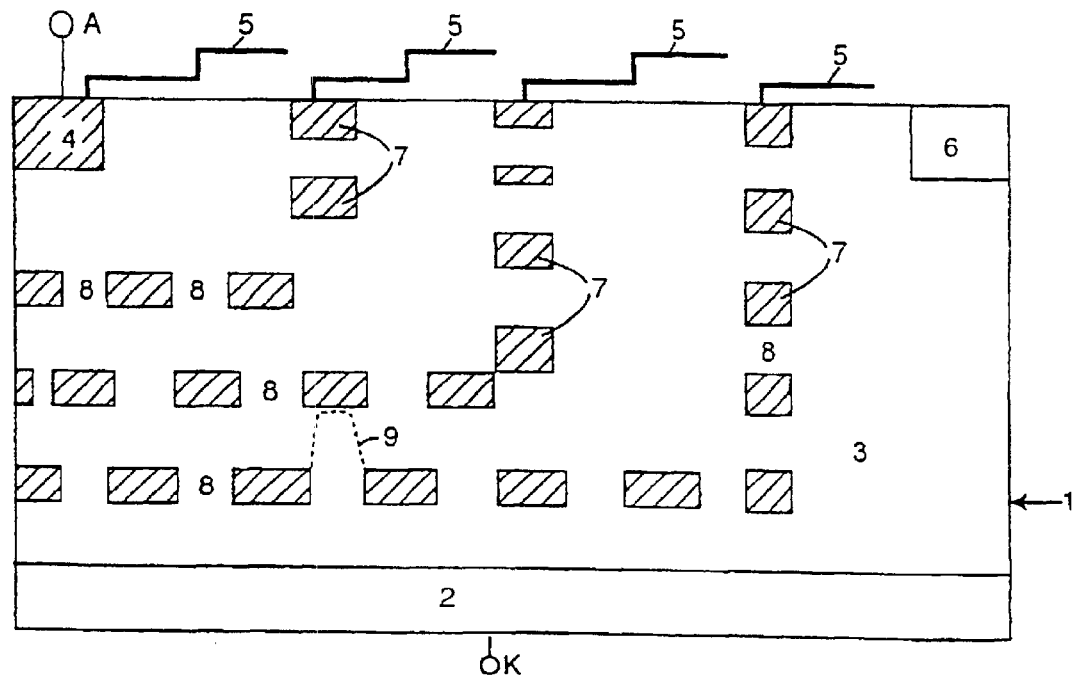
FIG. 2 is a diagrammatic sectional view of a diode having a patterned semiconductor body and regions of the second conductivity type which are interrupted in the edge region.

FIG. 2 shows a further exemplary embodiment of the invention, which differs from the exemplary embodiment of FIG. 1 by the fact that here the regions 7 are interrupted in the edge region, too, by a multiplicity of channels 8. A "field strength trapezoid" is also indicated here diagrammatically on one of the channels 8, by a broken line 9. The length of this field strength trapezoid is determined by the length of the semiconductor body 1 between the regions 7, that is to say by the width of the channel 8 of the first conductivity type. In other words, the length of the field strength trapezoid depends on the distance between two adjacent regions of the second conductivity type. By correspondingly increasing the number of regions 7 of the second conductivity type, it is thus possible to string together practically any desired number of field strength trapezoids, which leads to a corresponding increase of the reverse voltage.

Figure 3:
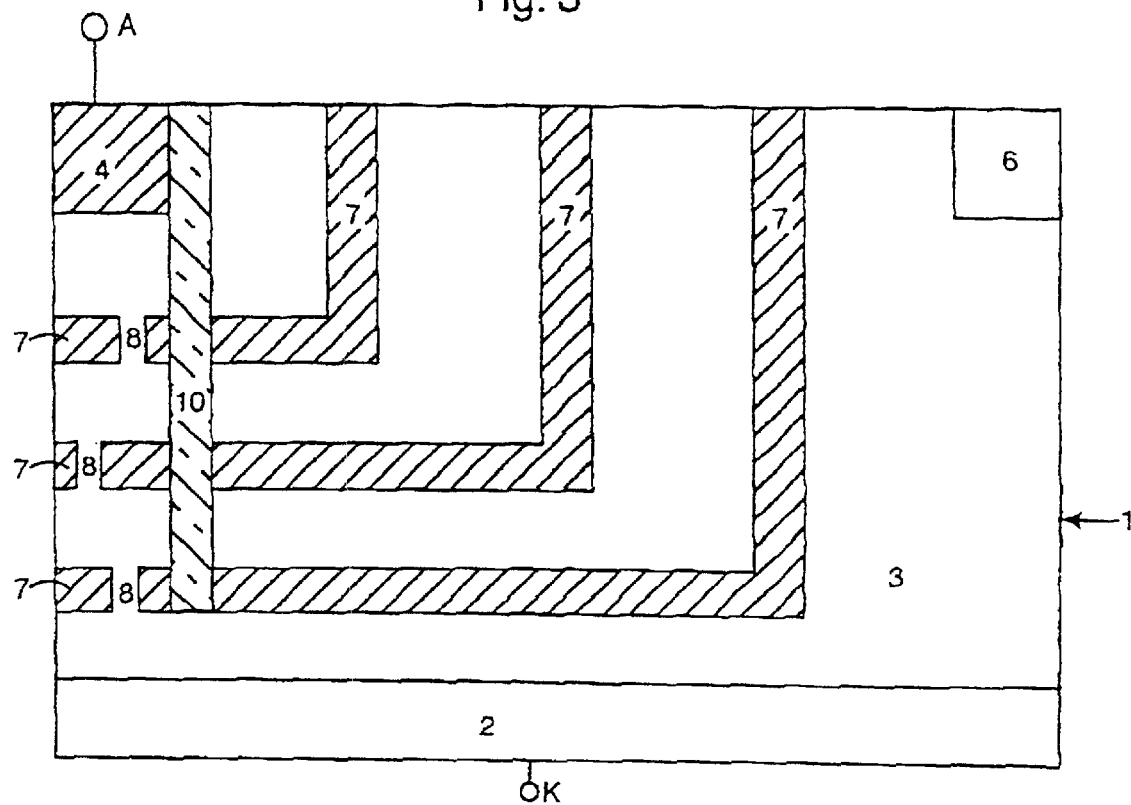
FIG. 3 is a diagrammatic sectional view of a diode having a patterned semiconductor body and regions of the second conductivity type which are continuous in the edge region, and also having an incorporated insulating zone for shielding the charge carriers from the edge region.

FIG. 3 shows a further exemplary embodiment of the invention, in which—in a similar manner to the exemplary embodiment of FIG. 1—the p-conducting regions 7 are continuous in the edge region, with the result that there are channels 8 only in the drift region of the diode. Moreover, an insulating zone 10 made of silicon dioxide, for example, is additionally provided here, which insulating zone annularly surrounds the region below the zone 4 and shields charge carriers from the edge region. Accordingly, field plates 5 are not provided in this exemplary embodiment.

Figure 4:
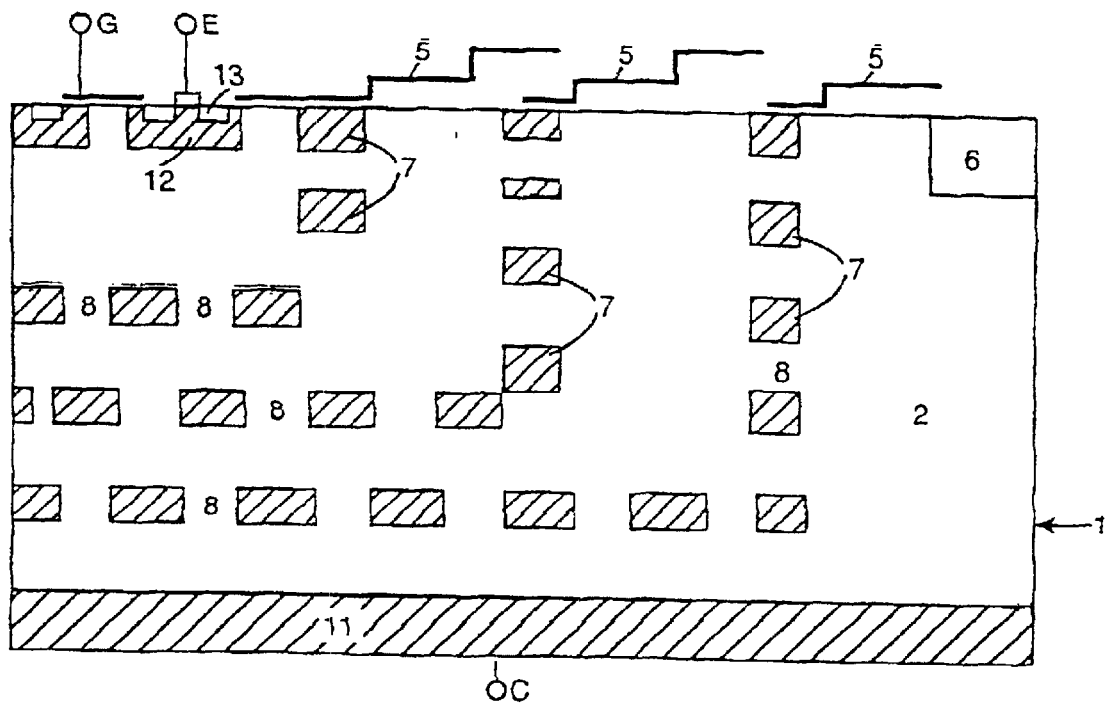
FIG. 4 is a diagrammatic sectional view of a MOS field-effect transistor having a patterned semiconductor body and regions of the second conductivity type which are interrupted in the edge region.

FIG. 4 shows a MOS field-effect transistor having an emitter electrode E, a gate electrode G and a collector electrode C. The collector electrode C is connected to a $p^+$-conducting zone 11, while the emitter electrode E is connected to a p-conducting zone 12 and an n-conducting zone 13 and the gate electrode G lies above the channel region formed by the zone 12 and is isolated in a customary manner from the semiconductor body by an insulating layer, for example, made of silicon dioxide. In this exemplary embodiment, in a similar manner to FIG. 2, the p-conducting regions 7 surround the zones 12 and 13 at a respective distance in a well-shaped manner and are in this case each isolated by channels 8 of the semiconductor body 2. Moreover field plates 5 for increasing the breakdown strength are additionally provided in the edge region of this MOS field-effect transistor.

Figure 5:
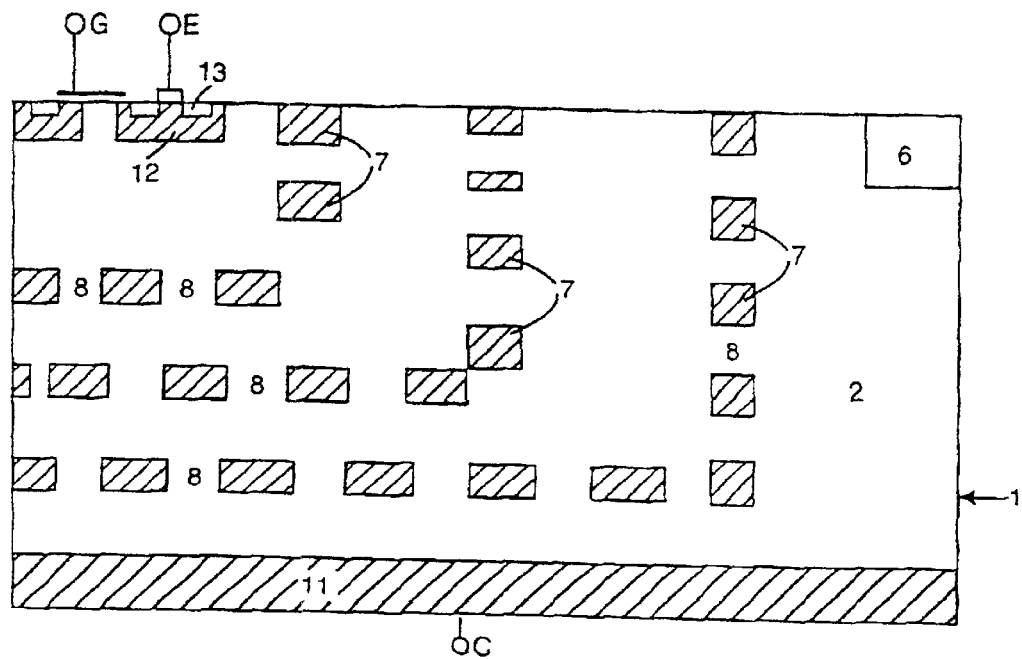
FIG. 5 is a diagrammatic sectional view of a MOS field-effect transistor having a patterned semiconductor body and regions of the second conductivity type which are interrupted in the edge region, but, in contrast to the MOS field-effect transistor of FIG. 4, no field plates are provided.

FIG. 5 shows a further exemplary embodiment of the invention with a MOS field-effect transistor which corresponds to the MOS field-effect transistor of FIG. 4 but has no field plates 5.

As is shown in FIGS. 1 and 2, the field plates 5 can be connected to the p-conducting regions 5. However, they can also be floating, as is illustrated in FIG. 4.

Figure 6:
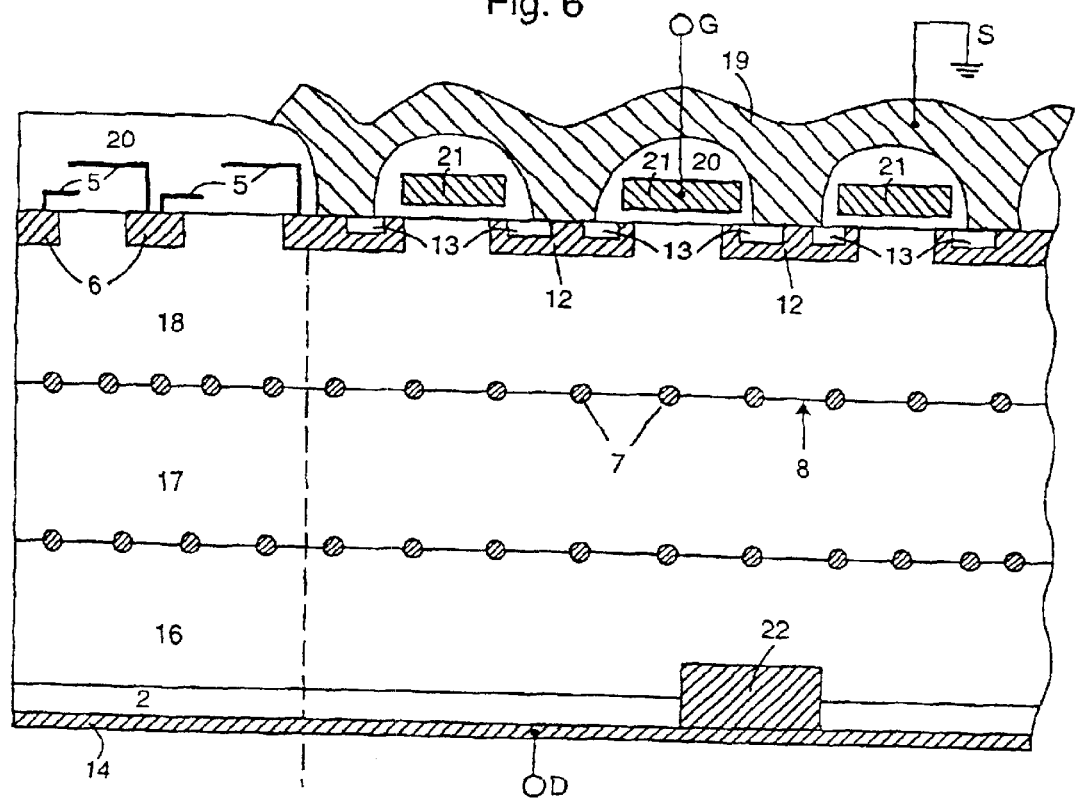
FIG. 6 is a diagrammatic sectional view of a MOS field-effect transistor having an injector.

FIG. 6 shows a further exemplary embodiment of the invention, in which the semiconductor body includes, instead of the semiconductor layer 3, a plurality of differently doped epitaxial layers 16, 17 and 18, between each of which the regions 7 are introduced for example by ion implantation. In this connection, it should be noted that in the previous exemplary embodiments of FIGS. 1 to 5, too, the individual regions 5 can be produced by corresponding deposition of individual, identically doped layers and ion implantation steps. Moreover, a source metallization layer 19 connected to a terminal S, an insulating layer 20 made of silicon dioxide, gate electrodes 21 made, for example, of doped polycrystalline silicon and a p-conducting zone 22 are additionally shown in the exemplary embodiment of FIG. 6. Instead of this p-conducting zone 22, it is also possible to provide a weak injector, for example a Schottky barrier layer. This zone 22 can have the same layer thickness as the substrate 2 or be thicker than the latter. Adjacent to the substrate layer 2 is a layer 14, which is connected to a terminal D.

We claim:

1. A semiconductor component, comprising:
    a semiconductor body of a first conductivity type, said semiconductor body having a first doping concentration greater than $5 \times 10^{13}$ charge carriers cm$^{-3}$ and having a first surface and a second surface, said first and second surfaces being provided opposite from one another;
    at least a first electrode disposed on said first surface and at least a second electrode disposed on said second surface;
    a semiconductor zone of a second conductivity type opposite to the first conductivity type;
    a pn-junction formed between said semiconductor zone of the second conductivity type and said semiconductor body;
    at least one of said first and second electrodes being in contact with said semiconductor zone of the second conductivity type;
    semiconductor regions of the second conductivity type provided in said semiconductor body;
    said semiconductor regions being disposed at a respective distance from said semiconductor zone of the second conductivity type such that said semiconductor regions surround said semiconductor zone of the second conductivity type in a well-shape;
    each one of said semiconductor regions being interrupted at at least one location by channels formed by said semiconductor body, said channels electrically connecting parts of said semiconductor body separated by said semiconductor regions; and
    said semiconductor regions of the second conductivity type having a second doping concentration such that said semiconductor regions are not completely depleted of charge carriers in case of a reverse-biasing of said pn-junction.

2. The semiconductor component according to claim 1, wherein each one of said semiconductor regions of the second conductivity type are interrupted at a plurality of locations by said channels formed by said semiconductor body for increasing a reverse voltage.

3. The semiconductor component according to claim 1, wherein said channels are configured such that electric field spikes are avoided when a reverse voltage is applied between said first and second electrodes.

4. The semiconductor component according to claim 1, wherein:
    said semiconductor body has a drift region; and
    said channels are provided in said drift region.

5. The semiconductor component according to claim 1, wherein:
    said semiconductor body has an edge region; and
    said channels are provided in said edge region.

6. The semiconductor component according to claim 1, wherein:
    said semiconductor body has an edge zone; and
    an insulating zone is provided for shielding charge carriers from said edge zone.

7. The semiconductor component according to claim 1, including an injector disposed in at least one of said first and second surfaces.

8. The semiconductor component according to claim 1, wherein:
    one of said first and second surfaces surrounds said semiconductor zone of the second conductivity type; and
    field plates are provided on said one of said first and second surfaces.

9. The semiconductor component according to claim 1, wherein:
    said semiconductor body has an edge; and
    a doped guard ring zone of the first conductivity type surrounds said edge.

10. The semiconductor component according to claim 1, wherein the first conductivity type is an n-conductivity type.

11. A semiconductor configuration, comprising:
    a semiconductor component selected from the group consisting of a diode, a MOS transistor and a thyristor;
    said semiconductor component including:
    a semiconductor body of a first conductivity type, said semiconductor body having a first doping concentration greater than $5 \times 10^{13}$ charge carriers cm$^{-3}$ and having a first surface and a second surface, said first and second surfaces being provided opposite from one another;
    at least a first electrode disposed on said first surface and at least a second electrode disposed on said second surface;
    a semiconductor zone of a second conductivity type opposite to the first conductivity type;
    a pn-junction formed between said semiconductor zone of the second conductivity type and said semiconductor body;
    at least one of said first and second electrodes being in contact with said semiconductor zone of the second conductivity type;
    semiconductor regions of the second conductivity type provided in said semiconductor body;

said semiconductor regions being disposed at a respective distance from said semiconductor zone of the second conductivity type such that said semiconductor regions surround said semiconductor zone of the second conductivity type in a well-shape;

each one of said semiconductor regions being interrupted at at least one location by channels formed by said semiconductor body, said channels electrically connecting parts of said semiconductor body separated by said semiconductor regions; and said semiconductor regions of the second conductivity type having a second doping concentration such that said semiconductor regions are not completely depleted of charge carriers in case of a reverse-biasing of said pn-junction.

12. A semiconductor component, comprising:

a semiconductor body having a semiconductor layer of a first conductivity type with a doping concentration greater than $5 \times 10^{13}$ charge carriers $cm^{-3}$;

a semiconductor zone of a second conductivity type opposite to said semiconductor layer of said first conductivity type;

a pn-junction formed between said semiconductor zone and said semiconductor layer; and semiconductor regions of the second conductivity type in said semiconductor body, said semiconductor regions surrounding said semiconductor zone at a respective distance except for a channel formed of said semiconductor layer interrupting each respective one of said semiconductor regions and electrically connecting parts of said semiconductor body separated by said semiconductor regions, said semiconductor regions having a doping concentration preventing completely depleted of charge carriers upon a reverse-biasing of said pn-junction.

13. The semiconductor component according to claim 12, wherein said channel is one of a plurality of channels for increasing a reverse voltage.

14. The semiconductor component according to claim 12, wherein said channel is configured such that electric field spikes are avoided when a reverse voltage is applied between said semiconductor zone and said semiconductor body.

15. The semiconductor component according to claim 12, wherein said semiconductor body has a drift region and said channel is provided in said drift region.

16. The semiconductor component according to claim 12, wherein said semiconductor body has an edge region and said channel is provided in said edge region.

17. The semiconductor component according to claim 12, wherein said semiconductor body has an edge zone and an insulating zone is provided for shielding charge carriers from said edge zone.

18. The semiconductor component according to claim 12, wherein said semiconductor body has a first surface and a second surface, one of said first and second surfaces surrounds said semiconductor zone of the second conductivity type, and field plates are provided on said one of said first and second surfaces.

19. The semiconductor component according to claim 12, wherein said semiconductor body has an edge, and a doped guard ring zone of the first conductivity type surrounds said edge.

20. The semiconductor component according to claim 12, wherein the first conductivity type is an n-conductivity type.

* * * * *